United States Patent
Harada et al.

(10) Patent No.: US 9,505,166 B2
(45) Date of Patent: Nov. 29, 2016

(54) RECTANGULAR MOLD-FORMING SUBSTRATE

(71) Applicant: SHIN-ETSU CHEMICAL CO., LTD., Tokyo (JP)

(72) Inventors: Daijitsu Harada, Joetsu (JP); Daiyu Okafuji, Joetsu (JP); Hiroyuki Yamazaki, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/068,983

(22) Filed: Oct. 31, 2013

(65) Prior Publication Data

US 2014/0120198 A1 May 1, 2014

(30) Foreign Application Priority Data

Nov. 1, 2012 (JP) ................................ 2012-241499
Jul. 4, 2013 (JP) ................................ 2013-140803

(51) Int. Cl.
*B29C 59/02* (2006.01)
*G03F 7/00* (2006.01)
(Continued)

(52) U.S. Cl.
CPC .......... *B29C 59/022* (2013.01); *G03F 7/0002* (2013.01); *B29C 59/002* (2013.01); *B29C 59/026* (2013.01); *B29C 59/16* (2013.01); *C03C 15/02* (2013.01); *G03F 1/14* (2013.01); *G03F 1/60* (2013.01)

(58) Field of Classification Search
CPC .......... G03F 1/60; G03F 1/14; G03F 7/0002; B29C 59/16; B29C 59/022; B29C 59/023; B29C 59/026; B29C 59/002; C03C 15/02

USPC ...... 428/157, 426; 425/385, 174.4; 264/292, 264/220

See application file for complete search history.

(56) References Cited

U.S. PATENT DOCUMENTS 6,869,732 B2   3/2005  Takeuchi et al.
2011/0084417 A1   4/2011  Choi et al.
(Continued)

FOREIGN PATENT DOCUMENTS

EP   1253117 A1   10/2002
EP   1 795 506 A1   6/2007
(Continued)

OTHER PUBLICATIONS

Sawyer Technical Brief "Specification of Saw Wafer Flatness", revised Apr. 2006.*

(Continued)

*Primary Examiner* — Alison L Hindenlang
*Assistant Examiner* — Lawrence D Hohenbrink, Jr.
(74) *Attorney, Agent, or Firm* — Birch, Stewart, Kolasch & Birch, LLP (57) ABSTRACT

A rectangular substrate is used as a mold after it is provided with a topological pattern. The substrate has A-side and B-side opposed surfaces, the A-side surface being provided with the topological pattern. The A-side surface includes a central rectangular region of 1 to 50 mm by 1 to 50 mm having a flatness of up to 350 nm. Use of the mold-forming substrate prevents the occurrence of a pattern misalignment or pattern error between the step of forming a pattern on a mold-forming substrate and the transfer step. Transfer of a fine size and complex pattern is possible.

7 Claims, 5 Drawing Sheets

(51) Int. Cl.
  *B29C 59/00* (2006.01)
  *G03F 1/60* (2012.01)
  *C03C 15/02* (2006.01)
  *G03F 1/00* (2012.01)
  *B29C 59/16* (2006.01)

(56) References Cited

U.S. PATENT DOCUMENTS

2011/0171568 A1    7/2011    Sasaki et al.
2011/0318996 A1*   12/2011    Okafuji .................. B24B 7/241
                                                              451/41

FOREIGN PATENT DOCUMENTS

| | | |
|---|---|---|
| EP | 2 399 707 A2 | 12/2011 |
| JP | 3-54569 A | 3/1991 |
| JP | 2002-318450 A | 10/2002 |
| JP | 2005-533393 A | 11/2005 |
| JP | 2006-506814 A | 2/2006 |
| WO | WO 2004/016406 A1 | 2/2004 |
| WO | WO 2004/044651 A1 | 5/2004 |

OTHER PUBLICATIONS

Extended European Search Report, dated Jun. 9, 2015, for European Application No. 13191271.9.

* cited by examiner

RECTANGULAR MOLD-FORMING SUBSTRATE

CROSS-REFERENCE TO RELATED APPLICATION

This non-provisional application claims priority under 35 U.S.C. §119(a) on Patent Application Nos. 2012-241499 and 2013-140803 filed in Japan on Nov. 1, 2012 and Jul. 4, 2013, respectively, the entire contents of which are hereby incorporated by reference.

TECHNICAL FIELD

This invention relates to a rectangular substrate for forming a mold which is suited for use in the nanoimprint lithography and serves as a template for forming a topological pattern on a surface in the process of fabricating electronic devices, optical components, storage components, bioelectronic components and the like.

BACKGROUND ART

In the fabrication of electronic devices, optical components, storage components, bioelectronic components and the like, not only higher performance and further miniaturization are demanded, but also a reduction of the manufacture cost is required at the same time. Under the circumstances, the nanoimprint lithography (NIL) is highlighted since it can reduce the cost of micropatterning as compared with the conventional lithography processes. In the NIL process, a topological pattern is formed by mechanical means. Specifically a mold having a desired topological pattern on the surface is pressed to a resin layer of given thickness on a recipient substrate for thereby transferring the topological pattern on the mold to the resin layer. See Patent Document 1. The resin layer to which the topological pattern has been transferred by pressing is cured whereby the shape of the resin layer is retained. The cure may be implemented typically by UV cure and heat cure modes. In either mode, it is important to press the mold-forming substrate and the resin layer-bearing recipient substrate together while maintaining parallelism between them and providing a uniform pressure within the contact plane. The mold-forming substrate to be provided with a topological pattern is required to have a high shape precision. See Patent Document 2.

Mold-forming substrates used in the NIL process have different outer shapes including rectangular shape of 65 mm squares or 152 mm squares, and circular shape having a diameter of 50 mm, 100 mm, 150 mm or 200 mm, with a choice being made in accordance with the intended application. On the other hand, a region of the mold-forming substrate which plays the substantial mold role and on which a topological or protrusion/depression pattern is to be formed often has a smaller area (typically less than 4,000 mm$^2$) than the outer shape and is generally situated around the center of the mold-forming substrate. In general, there is a tendency that as the feature size of a pattern to be transferred becomes finer, the area where the pattern is formed becomes smaller.

The reason is that as the pattern feature size becomes finer, the accuracies required for mold-to-recipient substrate parallelism and pressure uniformity become higher; and if the area where the pattern is formed is smaller, these accuracies can be increased. On the other hand, the tendency that the outer shape of the mold is larger than the region where the pattern is formed is accounted for by the process of manufacturing a NIL mold. The NIL mold manufacture process generally includes a step of depositing a metal film by sputtering, a lithography step using an EB writer for transferring a desired fine pattern to the metal film, and a step of dry etching the patterned metal film and the recipient substrate surface. From the aspects of economy and feasibility, these steps often utilize in a share manner those equipment used in the traditional lithography technology. Accordingly, the size of a mold-forming substrate loaded on these equipment inevitably corresponds to the size of substrates used in the traditional lithography technology, leading to the tendency that the outer shape of the NIL mold is sized larger than the region where the pattern is formed.

In recent years, the photo (UV) nanoimprint lithography encounters an increasing demand to provide a mold with a finer size pattern or more complex pattern for transfer. From such a demand and for the above-mentioned reason, the flatness of a mold-forming substrate, especially the flatness of a region which is provided with a pattern and plays the substantial mold role is critical. As the pattern to be transferred is of finer size or more complexity, a stronger possibility arises that unless the surface is fully flat, a misalignment may occur between the pattern during the mold manufacture and the pattern during the transfer step, leading to pattern errors.

CITATION LIST

Patent Document 1: JP-A 2005-533393 (WO 2004/016406)
Patent Document 2: JP-A H03-54569
Patent Document 3: JP-A 2006-506814 (WO 2004/044651)
Patent Document 4: JP-A 2002-318450 (U.S. Pat. No. 6,869,732, EP 1253117A1)

SUMMARY OF INVENTION

An object of the invention is to provide a rectangular mold-forming substrate in which a pattern-forming region has a satisfactory flatness so that the mold-forming substrate is suitable for pressing the pattern-bearing surface of the substrate to a recipient substrate under a uniform pressure within the contact area while maintaining parallelism between them.

The inventors have found that the above problems are overcome using a rectangular mold-forming substrate including a central region where a topological pattern is to be formed, the central region having a satisfactory flatness.

In one aspect, the invention provides a rectangular substrate which is to be provided with a topological pattern for use as a mold, the substrate having A-side and B-side opposed surfaces, the A-side surface being to be provided with the topological pattern. The A-side surface includes a central rectangular region which is sized 1 to 50 mm by 1 to 50 mm and to be provided with the topological pattern, the central rectangular region having a flatness of up to 350 nm.

In a preferred embodiment, the distance t1' between the central rectangular region of the A-side surface and the B-side surface is equal to or greater than the distance t1 between a peripheral region of the A-side surface excluding the central rectangular region and the B-side surface (i.e., t1'≥t1).

In a preferred embodiment, the B-side surface includes an inner rectangular region extending inward from an inside position spaced 3 mm apart from the periphery of the B-side surface, the inner rectangular region having a flatness of up to 3 µm.

In a preferred embodiment, the B-side surface includes an inner rectangular region extending inward from an inside position spaced 3 mm apart from the periphery of the B-side surface, but excluding a central rectangular region of 50 to 100 mm by 50 to 100 mm in the B-side surface, the inner rectangular region having a flatness of up to 3 µm.

In a preferred embodiment, an average plane for the central rectangular region of the A-side surface is substantially parallel to an average plane for the B-side surface excluding a central rectangular region of 50 to 100 mm by 50 to 100 mm.

In a preferred embodiment, the central rectangular region of the A-side surface has a birefringence of up to 3 nm/cm.

In another aspect, the invention provides a rectangular substrate which is to be provided with a topological pattern for use as a mold, the substrate having A-side and B-side opposed surfaces, the A-side surface being to be provided with the topological pattern. The A-side surface includes a central rectangular region which is sized 1 to 50 mm by 1 to 50 mm and to be provided with the topological pattern, the central rectangular region has a flatness of up to 350 nm, and the B-side surface is provided with a recess or channel.

In a preferred embodiment, the distance t2' between the central rectangular region of the A-side surface and a region of the B-side surface where the recess or channel is not formed is equal to or greater than the distance t2 between a peripheral region of the A-side surface excluding the central rectangular region and the region of the B-side surface where the recess or channel is not formed (i.e., t2'≥t2).

In a preferred embodiment, the B-side surface includes an inner rectangular region extending inward from an inside position spaced 3 mm apart from the periphery of the B-side surface and excluding the recess or channel, the inner rectangular region having a flatness of up to 3 µm.

In a preferred embodiment, an average plane for the central rectangular region of the A-side surface is substantially parallel to an average plane for the B-side surface excluding the recess or channel.

In a preferred embodiment, the central rectangular region of the A-side surface has a birefringence of up to 3 nm/cm.

ADVANTAGEOUS EFFECTS OF INVENTION

Using the mold-forming substrate of the invention, the occurrence of a pattern misalignment or pattern error between the step of forming a pattern on a mold-forming substrate and the step of transferring the pattern to a recipient substrate is prevented. Transfer of a fine size and/or complex pattern is possible.

BRIEF DESCRIPTION OF DRAWINGS

FIGS. 3A-3B illustrate a rectangular mold-forming substrate which is worked in the B-side surface in a further embodiment of the invention; FIG. 3A showing the B-side surface provided with a recess and FIG. 3B showing the B-side surface provided with a channel.

DESCRIPTION OF EMBODIMENTS

In the following description, terms such as "front," "back," and the like are words of convenience and are not to be construed as limiting terms. The term "recess" refers to a bore which does not penetrate throughout the substrate in its thickness direction, that is, terminates midway with a bottom wall left while the non-through bore may be of circular, elliptic or rectangular shape in cross section. The term "central" refers to the center of a rectangular shape.

Figure 1:
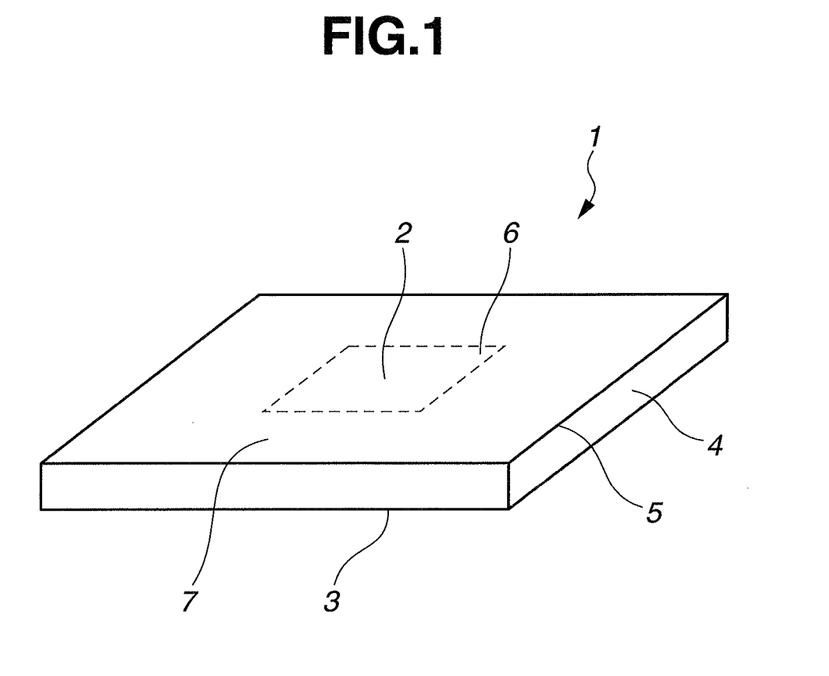
FIG. 1 is a perspective view of a rectangular mold-forming substrate in one embodiment of the invention.

Referring to FIG. 1, one exemplary rectangular mold-forming substrate according to one embodiment of the invention is illustrated. As shown in FIG. 1, the substrate 1 is a rectangular substrate from which a mold is formed, the substrate having an A-side surface 2 which is to be provided with a topological pattern, a B-side surface 3 opposite to the A-side surface 2, and a side surface 4. Most often, the boundary 5 defined by the upper or lower surface 2 or 3 and the side surface 4 is chamfered.

The rectangular mold-forming substrate is provided on its surface with a topological pattern consisting of protrusions and depressions before it is used as a mold. As shown in FIG. 1, the substrate 1 has the A-side surface 2 which is to be provided with a topological pattern and the B-side surface 3 opposed thereto. The A-side surface 2 includes a central rectangular region 6 which is situated at the center of the A-side surface 2, sized 1 to 50 mm by 1 to 50 mm, and to be provided with the topological pattern. According to the invention, the central rectangular region 6 should have a flatness of up to 350 nm, preferably up to 100 nm, and more preferably up to 50 nm.

The region whose flatness is limited is a central rectangular region 6 which is sized 1 to 50 mm by 1 to 50 mm. As understood from the standpoints of accuracy and efficiency in the overall process, a region in the substrate to be provided with a pattern is generally a central rectangular region sized 1 to 50 mm by 1 to 50 mm. The region may be either square or rectangular as long as it is sized 1 to 50 mm by 1 to 50 mm. While a flatness may be determined by measuring the thickness of a substrate at a plurality of points by a contact probe thickness gauge, a more accurate value of flatness may be measured by an optical interferometer or laser displacement sensor. In the disclosure, the flatness is a measurement by an optical interference type flatness tester Tropel UltraFlat® 200M (Corning Inc.).

If the flatness exceeds 350 nm, a misalignment of pattern position may occur between the step of forming a pattern on a rectangular mold-forming substrate and the step of transferring the pattern on the substrate to a recipient substrate, leading to a pattern error. Then a pressure is not uniformly applied to the pattern surface, tending to form chips on the pattern and to shorten the lifetime of the rectangular mold-forming substrate. For example, in the step of transferring the pattern by compressing the pattern-bearing mold to the recipient substrate having a resin layer of a predetermined thickness, the parallelism between the plane of the rectangular mold-forming substrate where the pattern is formed and the recipient substrate is aggravated, and so the pressure in the contact plane ceases to be uniform. Then the resin layer left after removal of the mold-forming substrate is not uniform in thickness. Even after the overall process including the subsequent steps of dry etching and metal film removal, the desired pattern is not formed. Although the lower limit of the flatness of the entire surface of the rectangular mold-forming substrate is not critical, there is a tendency that as the value of flatness is smaller, a rectangular region of 1 to 50 mm by 1 to 50 mm has a smaller value of flatness. Preferably an inner rectangular region of the A-side surface extending inward from an inside position spaced 3 mm apart from the periphery of the A-side surface, but excluding a central rectangular region of 1 to 50 mm by 1 to 50 mm has a flatness of up to 3 μm, more preferably up to 1 μm.

Preferably, the rectangular mold-forming substrate has a thickness of 1 to 10 mm, more preferably 3 to 8 mm. If the thickness is less than 1 mm, the mold-forming substrate even having a satisfactory flatness is prone to deform under the influences of a holder and deflection by its own weight, resulting in aggravated flatness, misalignment of pattern position, and pattern errors. If the thickness exceeds 10 mm, which indicates an increased volume and weight, then the substrate is difficult to handle and transport, and the increased material expense leads to an unwanted cost increase.

In one preferred embodiment, the mold-forming substrate is a quartz glass substrate. Due to its UV transmittance, the quartz glass substrate is often utilized in the nanoimprint technology that utilizes UV for curing of a resin layer. Although the NIL technology that utilizes heat for curing of a resin layer is also known, this technology is sensitive to thermal expansion. Thus the NIL technology that utilizes UV is allegedly suited for transferring a finer size pattern. Since quartz glass is transparent in the visible light spectrum as well, it has another advantage of easy alignment during the transfer step. Besides quartz glass, suitable materials for the mold-forming substrate for the NIL technology include silicon (Si), silicon oxide film, polydimethylsiloxane (PDMS), nickel (Ni), sapphire, and hybrid materials thereof.

The mold-forming substrate may have on its A-side surface a metal thin film or resist film for forming a transfer pattern. Preferably a metal thin film or resist film is deposited on the mold-forming substrate before a pattern is formed on the mold-forming substrate using an EB writing tool. The metal thin film or resist film may be deposited to a thickness of 5 nm to 5 μm by any standard method. When the thickness of the substrate on which the film has been formed is measured, preferably the substrate has a thickness of 1 to 10 mm and the A-side surface has a flatness of equal to or less than 350 nm in a central rectangular region of 1 to 50 mm by 1 to 50 mm.

While the mold-forming substrate may have some surface defects, those surface defects within the central rectangular region of 1 to 50 mm by 1 to 50 mm in the A-side surface should preferably have a size of up to 0.5 μm, more preferably up to 0.2 μm, and even more preferably up to 0.05 μm. The reason is that since a pattern having a feature size of the submicron to nanometer order is formed on the A-side surface of the mold-forming substrate, defects, if any, on the A-side surface of the mold-forming substrate can be transferred to the recipient substrate and in the same size. It is noted that the size of surface defects is measured by an atomic force microscope (AFM).

For ease of handling, the outer shape of the rectangular mold-forming substrate is sized 30 to 200 mm by 30 to 200 mm, especially 60 to 160 mm by 60 to 160 mm.

Figure 2A:
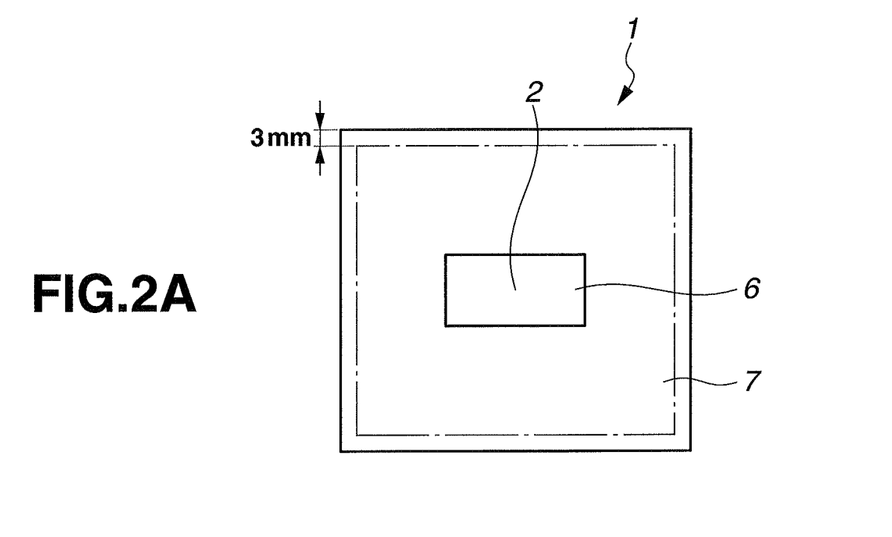
FIGS. 2A-2B illustrate a rectangular mold-forming substrate in another embodiment of the invention wherein t1'≥t1, FIG. 2A being a plan view and FIG. 2B being a cross-sectional view.
Figure 2B:
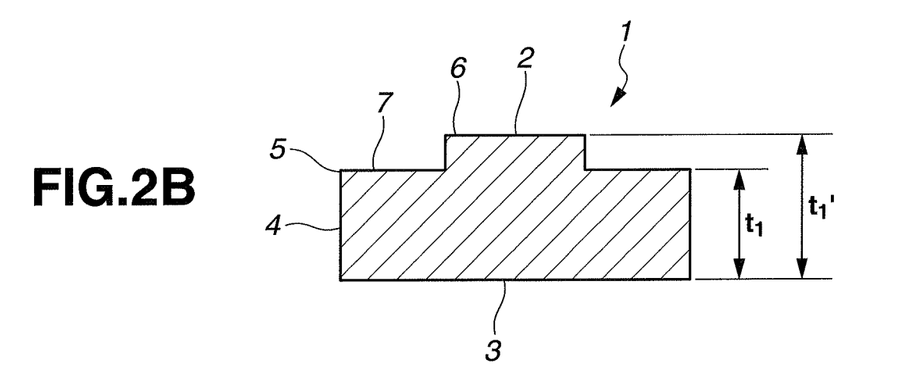

As shown in FIG. 2, the A-side surface 2 of the mold-forming substrate 1 includes a central rectangular region 6 of 1 to 50 mm by 1 to 50 mm, whose flatness should be limited to a specific range. In a preferred embodiment, the distance t1' between the central rectangular region 6 of the A-side surface 2 and the B-side surface 3 is equal to or greater than the distance t1 between a peripheral region 7 of the A-side surface 2 excluding the central rectangular region 6 of 1 to 50 mm by 1 to 50 mm and the B-side surface 3 (i.e., t1'≥t1). The reason why distance t1' is equal to or greater than distance t1 is that if the substrate is compliant with the shape of a NIL apparatus, it may be readily mounted in the NIL apparatus. More preferably, the value of t1'−t1 is 0 to 3 mm, especially 10 to 100 μm.

Of the A-side and B-side surfaces of the substrate, the B-side surface includes an inner rectangular region extending inward from an inside position spaced 3 mm apart from the periphery of the B-side surface, the inner rectangular region preferably having a flatness of up to 3 μm, more preferably up to 2 μm. In general, the rectangular mold-forming substrate is held at its B-side surface by a holder of vacuum suction, electrostatic chuck or another type. If the B-side surface has a poor flatness despite the satisfactory flatness of the A-side surface, the substrate is held by the holder, with the poor flatness B-side surface in close contact with the holder. As a result, the A-side surface to be provided with a pattern is inclined relative to the recipient substrate having a resin layer, leading to a pattern misalignment or patter error during the transfer step. The pressure is not uniformly applied to the pattern plane, tending to cause chipping of the pattern and shortening of the lifetime of the mold-forming substrate.

The lower limit of flatness is not critical, with a smaller value of flatness being better. A region of the entire surface whose flatness falls in a specific range is, if strictly prescribed, a region ensuring substantial precision measurement, that is, an inner rectangular region extending inward from an inside position spaced 3 mm apart from the periphery of the B-side surface. Since a peripheral region extending 3 mm from the periphery is near the chamfered boundary, a problem arises. On use of a contact type thickness gauge having a thickness measurement probe of a wide area, the thickness measurement probe may partially overlie the chamfered boundary. On use of an optical interferometer or laser displacement sensor, a peripheral region extending 3 mm from the periphery inhibits precise thickness measurement due to the influence of scattering light because the region is disposed near the side surface or chamfered edge.

Depending on a particular NIL apparatus, the point of contact by the holder varies. In Patent Document 3, for example, the apparatus holds the substrate at a relatively outer position of the back (B-side) surface. The preferred substrate which ensures satisfactory imprint transfer with such an apparatus is a substrate having a flatness of up to 3 μm, especially up to 2 μm, in a region of the B-side surface excluding a central rectangular region of 50 to 100 mm by 50 to 100 mm. Even if a central rectangular region of 50 to 100 mm by 50 to 100 mm in the B-side surface has a relatively poor flatness, the flatness of the central rectangular region of 50 to 100 mm by 50 to 100 mm in the B-side surface has no impact on the accuracy of transfer as long as the holding position by the NIL apparatus is outside the central region.

The other preferred substrate which ensures satisfactory imprint transfer with such an apparatus is a substrate in which an average plane for a central rectangular region of 1 to 50 mm by 1 to 50 mm in the A-side surface is substantially parallel to an average plane for the B-side surface excluding a central rectangular region of 50 to 100 mm by 50 to 100 mm. As used herein, the term "average plane" refers to a least squares plane as computed from a distance from an arbitrary reference plane. Also, the term "substantially parallel" means that the angle between normal vectors to the two average planes is equal to or less than 10 seconds, especially equal to or less than 5 seconds. Even when the parallelism between an average plane for a central rectangular region of 1 to 50 mm by 1 to 50 mm in the A-side surface and an average plane for a central rectangular region of 50 to 100 mm by 50 to 100 mm in the B-side surface is relatively poor, this poor parallelism has no impact on the accuracy of transfer as long as the holding position by the NIL apparatus is outside the central rectangular region of 50 to 100 mm by 50 to 100 mm in the B-side surface.

In a preferred embodiment of the rectangular mold-forming substrate, the central rectangular region of 1 to 50 mm by 1 to 50 mm in the A-side surface has a maximum birefringence of up to 3 nm/cm, more preferably up to 2 nm/cm, and even more preferably up to 1 nm/cm. Minimizing the birefringence in this manner keeps the effective region (to be provided with a topological pattern) in a reduced internal stress strain state, preventing the effective region from deformation by strain. Due to the reduced stress strain, the topological pattern formed thereon is increased in flexural, tensile and compression strengths, that is, the topological pattern has a sufficient strength to withstand imprint transfer. The maximum birefringence of the mold-forming substrate in the central rectangular region of 1 to 50 mm by 1 to 50 mm may be determined by using a birefringence evaluation system ABR-10A (UNIOPT Corp.), measuring a birefringence over the central rectangular region of 1 to 50 mm by 1 to 50 mm, and selecting the maximum thereof.

Figure 3A:
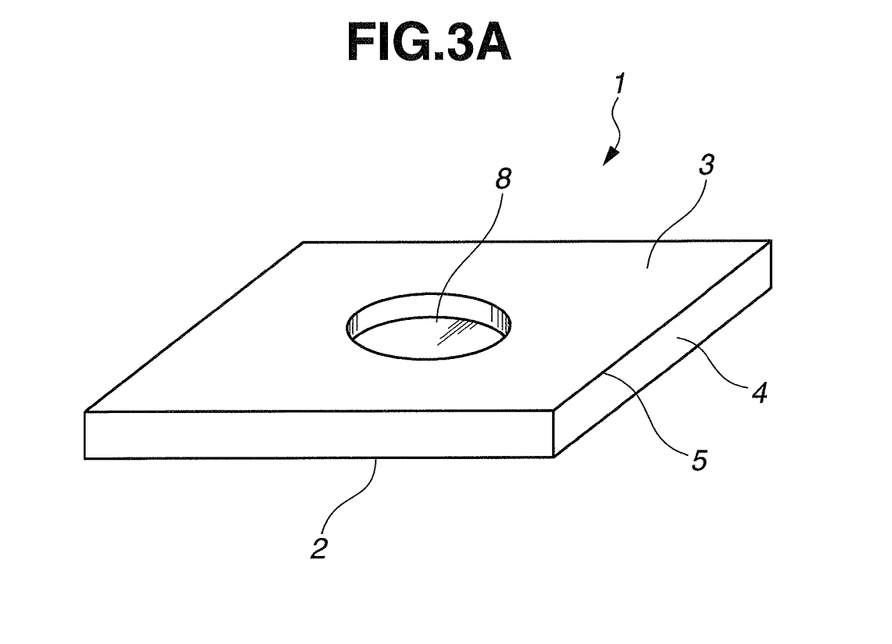
Figure 3B:
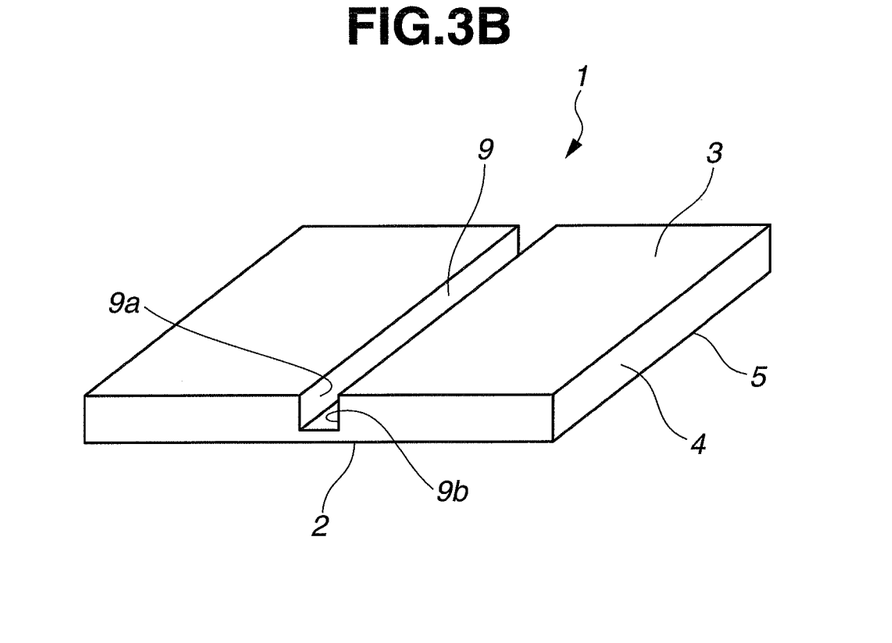

In a further preferred embodiment as shown in FIG. 3, the rectangular mold-forming substrate 1 which is used after providing the A-side surface with a topological pattern is a substrate having a flatness of up to 350 nm, more preferably up to 100 nm, and even more preferably up to 50 nm in a central rectangular region of 1 to 50 mm by 1 to 50 mm in the A-side surface 2, wherein the B-side surface 3 is provided with a recess 8 or a channel 9. When the substrate is provided in the B-side surface with the recess 8 or channel 9, the substrate becomes compliant with the shape of an exposure or NIL apparatus and is readily mountable in the apparatus.

The shape of the recess may be circular, oval, ellipsoidal, rectangular or polygonal in planar shape. The circular shape is preferred as shown in FIG. 3(A). The size of the recess is preferably in a range of 5 to 150 mm, in terms of diameter for circular shape, major diameter for oval or ellipsoidal shape, or diagonal length for rectangular shape. As to the channel, it is preferred that side walls 9a, 9b of channel 9 define parallel planes as shown in FIG. 3(B). However, the side walls of a channel need not be parallel; and one or both of the side walls of a channel may define a convex or concave curved surface.

Figure 4A:
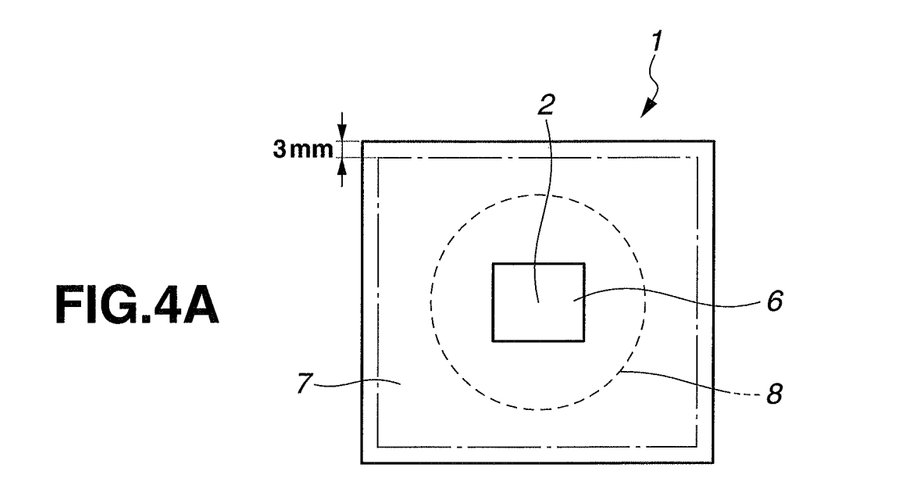
FIGS. 4A-4B illustrate a rectangular mold-forming substrate whose B-side surface is provided with a recess in the further embodiment of the invention wherein t2'≥t2, FIG. 4A being a plan view and FIG. 4B being a cross-sectional view.
Figure 4B:
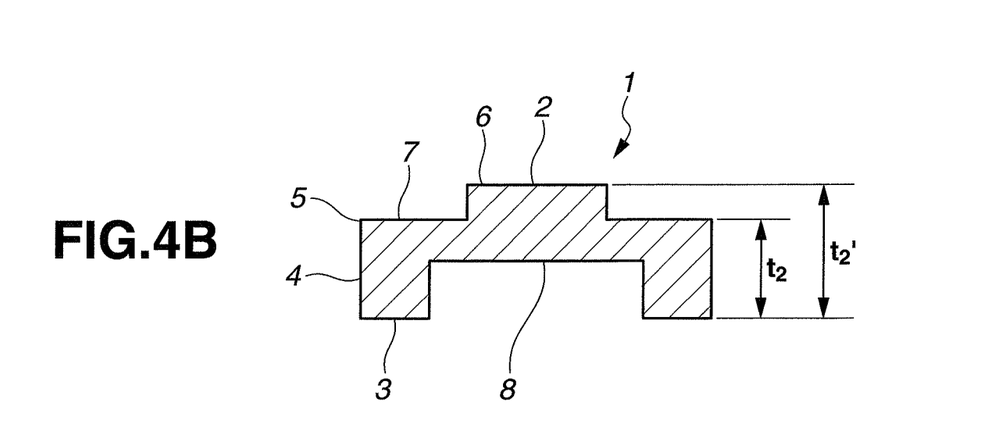
Figure 5A:
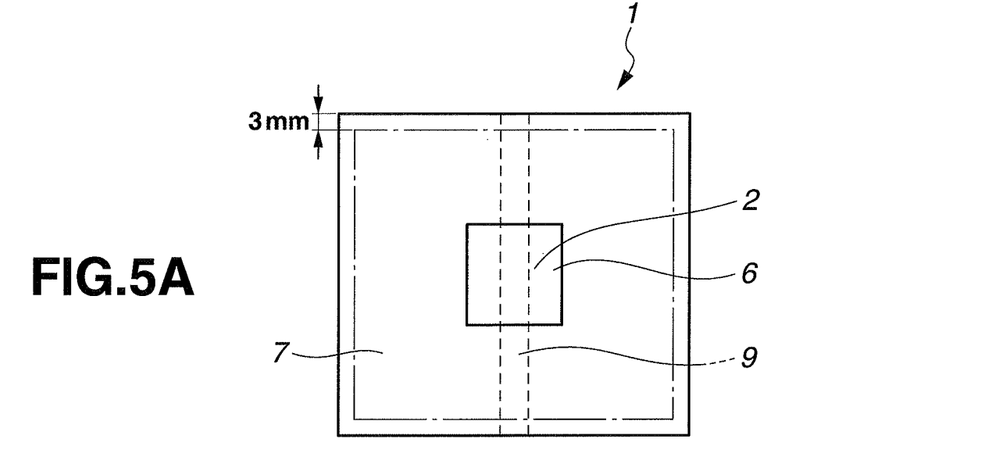
FIGS. 5A-5B illustrate a rectangular mold-forming substrate whose B-side surface is provided with a channel in the further embodiment of the invention wherein t2'≥t2, FIG. 5A being a plan view and FIG. 5B being a cross-sectional view.
Figure 5B:
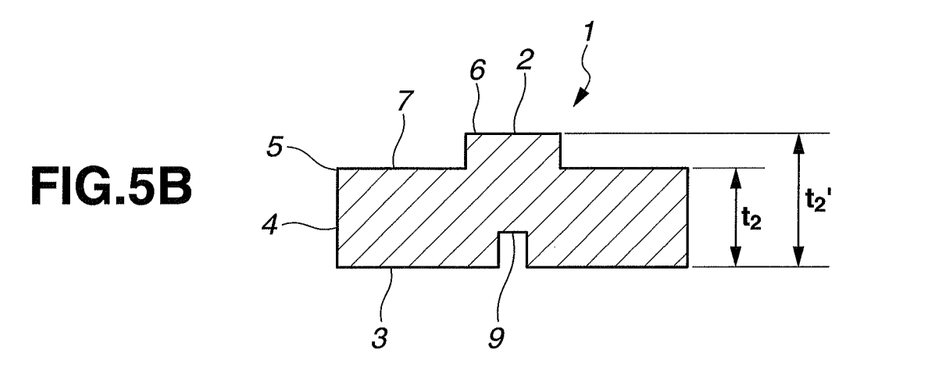

In a further preferred embodiment of the rectangular mold-forming substrate 1 having the recess 8 or channel 9, as shown in FIGS. 4 and 5, the distance t2' between the central rectangular region 6 of 1 to 50 mm by 1 to 50 mm in the A-side surface 2 (having a specific flatness) and a region of the B-side surface 3 where the recess or channel is not formed is equal to or greater than the distance t2 between a region 7 of the A-side surface 2 excluding the central rectangular region of 1 to 50 mm by 1 to 50 mm and the region of the B-side surface 3 where the recess or channel is not formed (i.e., t2'≥t2). More preferably, the value of t2'−t2 is 0 to 3 mm, especially 10 to 100 μm.

In a further preferred embodiment of the rectangular mold-forming substrate 1 having the recess 8 or channel 9, a region of the B-side surface excluding the recess or channel has a flatness of up to 3 μm, especially up to 2 μm. Also preferably, an average plane for the central rectangular region of 1 to 50 mm by 1 to 50 mm in the A-side surface is substantially parallel to an average plane for the region of the B-side surface excluding the recess or channel. Even when the parallelism between an average plane for the central rectangular region of 1 to 50 mm by 1 to 50 mm in the A-side surface and the bottom surface of the recess or channel in the B-side surface is relatively poor, this poor parallelism has no impact on the accuracy of transfer as long as the holding position by the NIL apparatus is in the region of the B-side surface excluding the recess or channel.

Next, it is described how to manufacture a rectangular mold-forming substrate according to the invention.

The rectangular mold-forming substrate of the invention may be obtained by polishing surfaces of a substrate such that the A-side surface of the substrate to be provided with a topological pattern may have a flatness of up to 350 nm in a central rectangular region of 1 to 50 mm by 1 to 50 mm. In addition, the A-side and B-side surfaces of the substrate are preferably polished so that the surfaces may have a flatness of up to 3 μm over the entire area. The polishing may be achieved by simultaneously polishing both the front and back surfaces by a double-side polishing machine or by polishing each surface by a single-side polishing machine, while feeding a polishing slurry containing abrasives. The single-side polishing machine uses a polishing plate which may be either larger or smaller than the mold-forming substrate. For example, a synthetic quartz glass substrate which can be used herein may be prepared by slicing a synthetic quartz glass stock and lapping according to the standard procedure.

The polishing step generally includes a primary or rough polishing step and a final or precise polishing step. To configure the profile of the A-side surface or the A-side and B-side surfaces of a rectangular mold-forming substrate so as to have a flatness within the desired range, the rough polishing step prior to the precise polishing step is of significance. For example, the rough polishing step is by simultaneously polishing the front and back surfaces of a substrate by means of a double-side polishing machine. At this point, upper and lower polishing plates each having a polishing pad attached thereto should preferably have a higher (better) flatness. The polishing pad may be made of rigid polyurethane foam or the like. In order that the polishing pad always maintain a high flatness on its surface, it is effective to carry out pellet dressing every several batches. Pellet dressing may be preferably carried out by using a dressing carrier such as a diamond pellet-laden dressing carrier, feeding a flow of water and abrasive grains, and applying a load of a balancing pressure to 30 gf/cm². Specifically, using a dressing carrier designed to fit in a gear of a selected polishing machine, the polishing pad surface is dressed for flatness for several minutes to several tens of minutes in the same manner as in ordinary polishing.

The polishing pad of rigid polyurethane foam commonly used in the rough polishing step is preferably provided with grooves so that the polishing slurry may spread over the entire substrate. Full coverage of the substrate with the polishing slurry minimizes in-plane polishing non-uniformity, resulting in a substrate with a good flatness. The shape of grooves in the polishing pad may be an array of striation having a plurality of parallel spaced-apart threads or furrows.

The polishing slurry for use in rough polishing may contain abrasive grains of silica, ceria, alundum, white alundum, FO (alumina-base abrasive by Fujimi Inc.), zirconia, SiC, diamond, titania, germania, etc. The abrasive grains may preferably have a particle size of 0.1 to 10 μm, more preferably 0.5 to 3 μm. The slurry may be a water slurry of such abrasive grains.

When the final precise polishing is intended to configure the profile of a substrate such that a central rectangular region of 1 to 50 mm by 1 to 50 mm in the A-side surface (to be provided with a topological pattern) may have a flatness of up to 350 nm and both the A-side and B-side surfaces have a flatness of up to 3 μm over their entire area, the surface profile control during the final precise polishing is important. For example, where a double-side polishing machine is used for polishing, a change of profile by polishing slightly differs between the upper and lower polishing plates. The flatness of the A-side and B-side surfaces of a substrate may be controlled, for example, by loading the substrate in the polishing machine at such an orientation that the flatness after polishing may fall in the desired range, controlling the ratio of carrier rotation to plate revolution, or selecting the position of holes in polishing carrier for receiving workpieces, i.e., the offset between the carrier center and the hole center. For effective profile control, it is preferred to confirm the flatness or profile of the A-side and B-side surfaces at the end of lapping and rough polishing. While confirmation may be made by measurement using an optical interferometer or laser displacement sensor, the optical interferometer is used in the practice of the invention.

Since the profile change by the final precise polishing is very small, preferably the profile of the A-side and B-side surfaces is established at the end of rough polishing step such that a central rectangular region of 1 to 50 mm by 1 to 50 mm in the A-side surface (to be provided with a topological pattern) may have a flatness of up to 350 nm and both the A-side and B-side surfaces have a flatness of up to 3 μm over their entire area. If the profile at the end of rough polishing step is outside the range, the substrate may be tailored by repeating the rough polishing step again for finishing to the desired flatness, or implementing a plasma etching technique capable of locally etching away protrusions (becoming the cause of poor flatness) for flattening, or a polishing technique using a compact polishing tool for local polishing, before the process proceeds to precise polishing step. If the flatness at the end of precise polishing step is outside the desired range, the desired flatness may be achieved by reducing the flatness at this stage using the plasma etching technique or the local polishing technique with a compact polishing tool. Such local polishing technique is described, for example, in Patent Document 4 (JP-A 2002-318450).

It is noted that the plasma etching and local polishing techniques tend to require a long time of working since local working is consecutively carried out. The working time is very long particularly when the flatness of a substrate to be tailored is far apart from the desired level. Also, when local polishing is carried out prior to the precise polishing step, for example, the polishing time may be shortened by using a polishing tool having a high polishing rate, despite of the disadvantage of frequent formation of fine flaws with a size of about 1 μm, because the local polishing step is followed by the precise polishing step. Inversely, when precise polishing is followed by local polishing, the surface as locally polished becomes the final surface where even fine flaws with a size of about 1 μm are not permissible. Then the local polishing step must use a relatively soft tool, which usually has a low polishing rate and needs a longer polishing time.

The final precise polishing step following the rough polishing step uses a polishing pad, which may be selected depending on the required surface quality, for example, from suede, urethane-impregnated nonwoven fabric, flexible urethane foam and the like. If the polishing slurry is not distributed uniformly over the entire substrate, or if chips as abraded are trapped within the polishing pad without being quickly carried away, then the polishing rate becomes non-uniform within the substrate, resulting in a poor flatness. This may be avoided by providing the polishing pad with grooves over its entire surface. The grooves help deliver the polishing slurry uniformly, the polishing slurry fully spreads throughout the substrate, and chips are quickly carried away through the grooves. Then the polishing rate can be controlled to improve a flatness or prevent a flatness from being aggravated. The shape of grooves may be an array of striation.

The precise polishing slurry may contain abrasive grains of silica, ceria, alundum, white alundum (WA), FO (alumina-base abrasive by Fujimi Inc.), zirconia, SiC, diamond, titania, germania, etc. The abrasive grains may preferably have a particle size of 5 to 1,000 nm, more preferably 10 to 150 nm. The preferred slurry may be a water slurry of such abrasive grains.

The rectangular mold-forming substrate may be assayed by measuring the flatness of the substrate by a flatness tester of optical interference system and judging whether or not it complies with the above-mentioned flatness requirement.

The step of working the rectangular mold-forming substrate so as to meet the relationship: $t1'>t1$ (wherein $t1'$ is a distance from the central rectangular region of 1 to 50 mm by 1 to 50 mm in the A-side surface to the B-side surface of the substrate and $t1$ is a distance from a peripheral region of the A-side surface excluding the central rectangular region of 1 to 50 mm by 1 to 50 mm to the B-side surface of the substrate) may be incorporated before or after the rough polishing step or after the precise polishing step. Desirably the working step is carried out after the precise polishing step in order to gain the desired flatness, for the following reason. When the process starts with a substrate having a stepped surface wherein $t1'>t1$, it is difficult to polish the substrate and finish it to a satisfactory flatness by the rough polishing or precise polishing step using a traditional polishing technique designed to polish a flat plate. The step of working the substrate so as to meet the relationship: $t1'>t1$ is to locally remove a peripheral region of the A-side surface excluding the central rectangular region of 1 to 50 mm by 1 to 50 mm by a suitable technique such as machining (using a machine tool), sand blasting, wet etching or dry etching, for thereby reducing $t1$.

The means for obtaining a rectangular mold-forming substrate having a maximum birefringence of up to 3 nm/cm in the central rectangular region of 1 to 50 mm by 1 to 50 mm may be any of well-known methods. In the case of synthetic quartz glass substrates, for example, the birefringence quantity may be reduced by slowly cooling synthetic quartz glass from 1,200° C. to 800° C. This slow cooling step may be carried out at the same time as the step of shaping a synthetic quartz glass ingot to the desired shape. Alternatively, slow cooling may be carried out in air or oxygen atmosphere after annealing of synthetic quartz glass following shaping.

The step of machining the B-side surface of the rectangular mold-forming substrate to form a recess or channel may be incorporated before or after the rough polishing step or after the precise polishing step. Desirably the machining step is carried out after the precise polishing step in order to gain the desired flatness, for the following reason. When the process starts with a substrate having a recess or channel, it is difficult to polish the substrate and finish it to a satisfactory flatness by the rough polishing or precise polishing step using a traditional polishing technique designed to polish a flat plate.

In the step of machining a substrate to form a recess or channel therein, a machining center or numerically controlled machine tool may be used. A grinding wheel is rotated and moved on a substrate surface to be worked under conditions that may not cause any crack, flaw or chips whereby a recess or channel of predetermined size and depth is formed.

Specifically, a grinding wheel having diamond or CBN abrasives electroplated or metal bonded is used and operated at a spindle rotational frequency of 100 to 30,000 rpm, preferably 1,000 to 15,000 rpm and a cutting speed of 1 to 10,000 mm/min, preferably 10 to 1,000 mm/min.

Optionally, the machined surface, that is, the bottom and side surfaces of the recess or channel is polished to mirror finish. The work damaged layer on the machined surface is removed to eliminate the residual stress induced by machining, thereby suppressing any shape change of the substrate due to the residual stress. If the bottom and side surfaces of the recess or channel are not mirror finished, complete removal of contaminants by cleaning is difficult, with a possibility that the pattern is contaminated with the remaining contaminants. Mirror finishing of the bottom and side surfaces of the recess or channel is also effective for increasing the strength of the bottom surface.

The step of polishing the machined surface, that is, the bottom and side surfaces of the recess or channel to mirror finish is carried out by contacting a working portion of a rotary polishing tool with the machined surface under a predetermined pressure and relatively moving the tool at a predetermined speed.

The rotary polishing tool may be of any type as long as its working portion is an abrasive rotary component. Examples include a spindle having a tool chucking portion or a precision grinder having a polishing tool mounted thereon (e.g., Leutor).

The type of material used in the polishing tool is not particularly limited as long as the working portion is a GC wheel, WA wheel, diamond wheel, cerium wheel, cerium pad, rubber wheel, felt buff, polyurethane or other component capable of working and removing workpiece stock.

When the recess or channel is polished by the rotary polishing tool with its working portion in contact with the machined surfaces (bottom and side surfaces of a recess or channel), a polishing abrasive slurry is preferably delivered to the polishing site. Examples of suitable abrasive grains used herein include silica, ceria, Alundum, white Alundum (WA), FO, zirconia, SiC, diamond, titania, and germania. The grain size is preferably in a range of 10 nm to 10 μm. A water slurry of such abrasives may be used.

The step of working the rectangular mold-forming substrate so as to meet the relationship: $t2'>t2$ (wherein $t2'$ is a distance from the central rectangular region of 1 to 50 mm by 1 to 50 mm in the A-side surface to the B-side surface of the substrate and $t2$ is a distance from a peripheral region of the A-side surface excluding the central rectangular region of 1 to 50 mm by 1 to 50 mm to the B-side surface of the substrate) may be incorporated before or after the rough polishing step or after the precise polishing step. Desirably the working step is carried out after the precise polishing step in order to gain the desired flatness, for the following reason. When the process starts with a substrate having a stepped surface wherein $t2'>t2$, it is difficult to polish the substrate and finish it to a satisfactory flatness by the rough polishing or precise polishing step using a traditional polishing technique designed to polish a flat plate. The step of working the substrate so as to meet the relationship: $t2'>t2$ may precede the step of machining the substrate to form a recess or channel, and vice versa. The step of working the substrate so as to meet the relationship: $t2'>t2$ and the step of machining the substrate to form a recess or channel may be carried out by the same techniques as described above.

EXAMPLE

Examples of the invention are given below by way of illustration and not by way of limitation.

Example 1

A synthetic quartz glass stock was sliced and lapped, obtaining a rectangular substrate precursor having an outer shape of 152 mm squares and a thickness of 6.50 mm, and lapped glass surfaces. The precursor was subjected to a rough polishing step using a rigid polyurethane foam pad in combination with cerium oxide abrasive grains having a relatively coarse particle size (average particle size 1.4 μm, trade name SHOROX by Showa Denko K.K.). The rough polishing was carried out using a double-side polishing machine. The surface of the polishing pad was controlled by forming grooves (groove pitch 3 cm, groove width 2 mm) in the surface of the rigid polyurethane foam pad, and performing diamond pellet dressing on the pad after the predetermined number of batches, such that the A-side and B-side surfaces (i.e., the A-side surface to be provided with a topological pattern and the B-side surface opposed thereto) of the quartz glass substrate as polished might have a desired flatness.

As a result of rough polishing, there was finished a quartz glass substrate of the desired design having a thickness of 6.35 mm and mirror finished surfaces. Using a flatness tester of optical interference system (Tropel UltraFlat 200M by Corning Inc.), the A-side surface was measured for flatness in a central region of 50 mm squares. The flatness of this region was 0.112 μm.

The substrate was then subjected to precise polishing into a flat mirror finish. Polishing was carried out by using a double-side polishing machine, mounting it with a suede polishing pad provided with an array of grooves at a pitch of 3 cm, and feeding a polishing slurry containing colloidal silica abrasive grains (average particle size 80 nm, Compol® 80, Fujimi Inc.). At the end of polishing, the substrate was carefully cleaned and dried, before the A-side surface to be provided with a topological pattern and the B-side surface opposed thereto of the substrate were determined for flatness. Using a flatness tester of optical interference system (Tropel UltraFlat 200M), the A-side surface was measured for flatness in a central region of 50 mm squares. The flatness of this region was 75 nm. The entire region of the B-side surface (exactly, a region of 146 mm squares excluding a peripheral band of 3 mm wide with a low measurement accuracy) had a flatness of 1.45 μm. A region of the B-side surface excluding a central region of 50-100 mm squares, specifically the entire region of the B-side surface excluding a central region of 50 mm squares (exactly, a region of 146 mm squares excluding a peripheral band of 3 mm wide with a low measurement accuracy and a central region of 50 mm squares) had a flatness of 1.45 µm. A normal vector to an average plane for the central region of 50 mm squares in the A-side surface and a normal vector to an average plane for a region of the B-side surface excluding the central region of 50 mm squares crossed at an angle of 2 seconds, indicating that they were substantially parallel. Surface defects in the central region of 50 mm squares had a size of less than 0.05 µm.

Example 2

By the same procedure as in Example 1, a starting substrate was prepared and worked until rough polishing. On flatness measurement, the A-side surface had a flatness of 0.30 µm in a central region of 50 mm squares. The substrate was then subjected to precise polishing as in Example 1. Using a compact polishing tool, protrusions in the central region of 50 mm squares were abraded off to improve the flatness.

The A-side surface of the resulting substrate was measured for flatness in a central region of 50 mm squares. The flatness of this region was 138 nm. The entire region of the B-side surface (exactly, a region of 146 mm squares excluding a peripheral band of 3 mm wide with a low measurement accuracy) had a flatness of 1.57 µm. A region of the B-side surface excluding a central region of 50-100 mm squares, specifically the entire region of the B-side surface excluding a central region of 50 mm squares (exactly, a region of 146 mm squares excluding a peripheral band of 3 mm wide with a low measurement accuracy and a central region of 50 mm squares) had a flatness of 1.36 µm. A normal vector to an average plane for the central region of 50 mm squares in the A-side surface and a normal vector to an average plane for a region of the B-side surface excluding the central region of 50 mm squares crossed at an angle of 4 seconds, indicating that they were substantially parallel. Surface defects in the central region of 50 mm squares had a size of less than 0.05 µm.

Example 3

By the same procedure as in Example 1, a starting substrate was prepared and worked until rough polishing. On flatness measurement, the A-side surface had a flatness of 47 nm in a central rectangular region of 10 mm by 20 mm. The substrate was then subjected to precise polishing as in Example 1. The A-side surface of the precisely polished substrate had a flatness of 0.044 µm in a central rectangular region of 10 mm by 20 mm, and the entire region of the B-side surface (exactly, a region of 146 mm squares excluding a peripheral band of 3 mm wide with a low measurement accuracy) had a flatness of 1.55 µm.

The central rectangular region of 10 mm by 20 mm in the A-side surface of the substrate was masked with a Cr film and photoresist which were locally deposited by photolithography. The substrate was immersed in a 30 wt % hydrofluoric acid aqueous solution at room temperature for 50 minutes for etching the substrate exclusive of the central rectangular region of 10 mm by 20 mm in the A-side surface to a depth of 0.020 mm. Etching was such that the distance $t1'$ from the central rectangular region of 10 mm by 20 mm in the A-side surface to the B-side surface of the substrate and the distance $t1$ from an etched region of the A-side surface excluding the central rectangular region of 10 mm by 20 mm to the B-side surface of the substrate were $t1'=t1+0.020$ mm, meeting the relationship: $t1' \geq t1$.

The A-side surface of the substrate as etched had a flatness of 45 nm in the central rectangular region of 10 mm by 20 mm, and the entire region of the B-side surface (exactly, a region of 146 mm squares excluding a peripheral band of 3 mm wide with a low measurement accuracy) had a flatness of 1.74 µm. A region of the B-side surface excluding a central region of 50-100 mm squares, specifically the entire region of the B-side surface excluding a central region of 50 mm squares (exactly, a region of 146 mm squares excluding a peripheral band of 3 mm wide with a low measurement accuracy and a central region of 50 mm squares) had a flatness of 1.56 µm. A normal vector to an average plane for the central rectangular region of 10 mm by 20 mm in the A-side surface and a normal vector to an average plane for a region of the B-side surface excluding the central region of 50 mm squares crossed at an angle of 4 seconds, indicating that they were substantially parallel. Surface defects in the central region of 10 mm by 20 mm had a size of less than 0.05 µm.

Example 4

By the same procedure as in Example 1, a starting substrate was prepared and worked until rough polishing. On flatness measurement, the A-side surface had a flatness of 110 nm in a central region of 50 mm squares. The substrate was then subjected to precise polishing as in Example 1. The A-side surface of the precisely polished substrate had a flatness of 0.097 µm in a central region of 50 mm squares, and the entire region of the B-side surface (exactly, a region of 146 mm squares excluding a peripheral band of 3 mm wide with a low measurement accuracy) had a flatness of 1.78 µm.

Using a machining center, the B-side surface at its center was machined to form a circular recess having a diameter of 80 mm and a depth of 5 mm. The machined surfaces, i.e., the bottom and side surfaces of the recess were polished to a mirror finish using a wool felt buff and cerium oxide abrasive grains (average particle size 1.4 µm, trade name SHOROX by Showa Denko K.K.). At the end of mirror finish buffing, flatness of the substrate was measured. After the recess formation, the central region of 50 mm squares of the A-side surface had a flatness of 0.154 µm, and the entire region of the B-side surface excluding the recess of diameter 80 mm (exactly, a region of 146 mm squares excluding a peripheral band of 3 mm wide with a low measurement accuracy and the recess of diameter 80 mm) had a flatness of 1.49 µm. A normal vector to an average plane for the central region of 50 mm squares in the A-side surface and a normal vector to an average plane for the region of the B-side surface excluding the central recess of diameter 80 mm crossed at an angle of 3.5 seconds, indicating that they were substantially parallel. Surface defects in the central region of 50 mm squares had a size of less than 0.05 µm.

Example 5

By the same procedure as in Example 1, a starting substrate was prepared and worked until rough polishing. On flatness measurement, the A-side surface had a flatness of 118 nm in a central region of 50 mm squares. The substrate was then subjected to precise polishing as in Example 1. The A-side surface of the precisely polished substrate had a flatness of 0.107 µm in a central region of 50 mm squares, and the entire region of the B-side surface (exactly, a region of 146 mm squares excluding a peripheral band of 3 mm wide with a low measurement accuracy) had a flatness of 1.61 µm.

Using a machining center, the B-side surface at its center was machined to form a channel having a depth of 3 mm, a width of 30 mm and a length of 152 mm and extending parallel to the side surfaces. At the end of machining, flatness of the substrate was measured. After the channel formation, the central region of 50 mm squares in the A-side surface had a flatness of 0.120 µm, and the entire region of the B-side surface excluding the channel of 30 mm wide and 152 mm long (exactly, a region of 146 mm squares excluding a peripheral band of 3 mm wide with a low measurement accuracy and the channel of 30 mm by 152 mm) had a flatness of 1.55 µm. A normal vector to an average plane for the central region of 50 mm squares in the A-side surface and a normal vector to an average plane for the region of the B-side surface excluding the channel of 30 mm wide and 152 mm long crossed at an angle of 4 seconds, indicating that they were substantially parallel. Surface defects in the central region of 50 mm squares had a size of less than 0.05 µm.

Example 6

By the same procedure as in Example 1, a starting substrate was prepared and worked until rough polishing. On flatness measurement, the A-side surface had a flatness of 87 nm in a central rectangular region of 30 mm by 50 mm. The substrate was then subjected to precise polishing as in Example 1. The A-side surface of the precisely polished substrate had a flatness of 0.085 µm in a central rectangular region, of 30 mm by 50 mm, and the entire region of the B-side surface (exactly, a region of 146 mm squares excluding a peripheral band of 3 mm wide with a low measurement accuracy) had a flatness of 1.64 µm.

The central rectangular region of 30 mm by 50 mm in the A-side surface of the substrate was masked with a Cr film and photoresist which were locally deposited by photolithography. The substrate was immersed in a 50 wt % hydrofluoric acid aqueous solution at room temperature for 90 minutes for etching the substrate exclusive of the central rectangular region of 30 mm by 50 mm in the A-side surface to a depth of 0.050 mm. Etching was such that the distance t1' from the central rectangular region of 30 mm by 50 mm in the A-side surface to the B-side surface of the substrate and the distance t1 from an etched region of the A-side surface excluding the central rectangular region of 30 mm by 50 mm to the B-side surface of the substrate were t1'=t1+0.050 mm, meeting the relationship: t1'≥t1.

Using a machining center, the B-side surface at its center was machined to form a circular recess having a diameter of 70 mm and a depth of 4 mm. The machined surfaces, i.e., the bottom and side surfaces of the recess were polished to a mirror finish using a wool felt buff and cerium oxide abrasive grains (average particle size 1.4 µm, trade name SHOROX by Showa Denko K.K.).

At the end of mirror finish buffing, flatness of the substrate was measured. After the recess formation, the central rectangular region of 30 mm by 50 mm in the A-side surface had a flatness of 0.091 µm, and the entire region of the B-side surface excluding the recess of diameter 70 mm (exactly, a region of 146 mm squares excluding a peripheral band of 3 mm wide with a low measurement accuracy and the recess of diameter 70 mm) had a flatness of 1.63 µm. A normal vector to an average plane for the central region of 50 mm squares in the A-side surface and a normal vector to an average plane for the region of the B-side surface excluding the central recess of diameter 70 mm crossed at an angle of 4.5 seconds, indicating that they were substantially parallel. Surface defects in the central rectangular region of 30 mm by 50 mm had a size of less than 0.05 µm.

Example 7

By the same procedure as in Example 1, a starting substrate was prepared and worked until rough polishing. On flatness measurement, the A-side surface had a flatness of 75 nm in a central rectangular region of 20 mm by 40 mm. The substrate was then subjected to precise polishing as in Example 1. The A-side surface of the precisely polished substrate had a flatness of 0.071 µm in a central rectangular region of 20 mm by 40 mm, and the entire region of the B-side surface (exactly, a region of 146 mm squares excluding a peripheral band of 3 mm wide with a low measurement accuracy) had a flatness of 1.53 µm.

Using a machining center, the A-side surface of the substrate was machined to a depth of 1.5 mm except the central rectangular region of 20 mm by 40 mm, such that the distance t1' from the central rectangular region of 20 mm by 40 mm in the A-side surface to the B-side surface of the substrate and the distance t1 from a machined region of the A-side surface excluding the central rectangular region of 20 mm by 40 mm to the B-side surface of the substrate were t1'=t1+1.5 mm, meeting the relationship: t1'≥t1.

Using a machining center, the B-side surface at its center was machined to form a channel having a depth of 2 mm, a width of 10 mm and a length of 152 mm and extending parallel to the side surfaces. At the end of machining, flatness of the substrate was measured. After the channel formation, the central rectangular region of 20 mm by 40 mm in the A-side surface had a flatness of 0.072 µm, and the entire region of the B-side surface excluding the channel of 20 mm wide and 152 mm long (exactly, a region of 146 mm squares excluding a peripheral band of 3 mm wide with a low measurement accuracy and the channel of 20 mm by 152 mm) had a flatness of 1.51 µm. A normal vector to an average plane for the central region of 50 mm squares in the A-side surface and a normal vector to an average plane for the region of the B-side surface excluding the channel of 20 mm wide and 152 mm long crossed at an angle of 4 seconds, indicating that they were substantially parallel. Surface defects in the central rectangular region of 20 mm by 40 mm had a size of less than 0.05 µm.

Comparative Example 1

A synthetic quartz glass stock was sliced, lapped, and roughly polished. Note that the rough polishing step used a polishing pad of rigid polyurethane foam which had been used for several tens of polishing batches, without intermediate dressing with diamond pellets, and had a poor flatness on its surface, specifically a flatness of 50 µm. At the end of rough polishing, the A-side surface had a flatness of 0.38 µm in a central region of 50 mm squares.

The substrate was then subjected to precise polishing into a flat mirror finish. Polishing was carried out by using a double-side polishing machine, mounting it with a suede polishing pad provided with an array of grooves at a pitch of 3 cm, and feeding a polishing slurry containing colloidal silica abrasive grains (average particle size 80 nm, Compol® 80, Fujimi Inc.).

At the end of polishing, the substrate was carefully cleaned and dried. The A-side surface and the B-side surface opposed thereto of the substrate were determined for flatness, using a flatness tester (Tropel UltraFlat 200M). The A-side surface had a flatness of 0.54 μm in the central region of 50 mm squares. The entire region of the B-side surface (exactly, a region of 146 mm squares excluding a peripheral band of 3 mm wide with a low measurement accuracy) had a flatness of 3.84 μm. A region of the B-side surface excluding a central region of 50-100 mm squares, specifically the entire region of the B-side surface excluding a central region of 50 mm squares (exactly, a region of 146 mm squares excluding a peripheral band of 3 mm wide with a low measurement accuracy and a central region of 50 mm squares) had a flatness of 3.60 μm. A normal vector to an average plane for the central region of 50 mm squares in the A-side surface and a normal vector to an average plane for the region of the B-side surface excluding the central region of 50 mm squares crossed at an angle of 56 seconds.

Japanese Patent Application Nos. 2012-241499 and 2013-140803 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A rectangular substrate which is to be provided with a topological pattern for use as a mold, the substrate having A-side and B-side opposed surfaces, the A-side surface is to be provided with the topological pattern, wherein
the A-side surface includes a central rectangular region which is sized 1 to 50 mm by 1 to 50 mm and to be provided with the topological pattern, the central rectangular region having a flatness of up to 350 nm,
the distance t1' between the central rectangular region of the A-side surface and the B-side surface is greater than the distance t1 between a peripheral region of the A-side surface excluding the central rectangular region and the B-side surface (t1'>t1),
an average plane for the central rectangular region of the A-side surface is substantially parallel to an average plane for the B-side surface excluding a central rectangular region of 50 to 100 mm by 50 to 100 mm, and
an angle between normal vectors to the two average planes is equal to or less than 5 seconds.

2. The substrate of claim 1 wherein the B-side surface includes an inner rectangular region extending inward from an inside position spaced 3 mm apart from the periphery of the B-side surface, the inner rectangular region having a flatness of up to 3 μm.

3. The substrate of claim 1 wherein the B-side surface includes an inner rectangular region extending inward from an inside position spaced 3 mm apart from the periphery of the B-side surface, but excluding a central rectangular region of 50 to 100 mm by 50 to 100 mm in the B-side surface, the inner rectangular region having a flatness of up to 3 μm.

4. The substrate of claim 1 wherein the central rectangular region of the A-side surface has a birefringence of up to 3 nm/cm.

5. A rectangular substrate which is to be provided with a topological pattern for use as a mold, the substrate having A-side and B-side opposed surfaces, the A-side surface is to be provided with the topological pattern, wherein
the A-side surface includes a central rectangular region which is sized 1 to 50 mm by 1 to 50 mm and to be provided with the topological pattern, the central rectangular region having a flatness of up to 350 nm,
the B-side surface is provided with a recess or channel,
the distance t2' between the central rectangular region of the A-side surface and a region of the B-side surface where the recess or channel is not formed is greater than the distance t2 between a peripheral region of the A-side surface excluding the central rectangular region and the region of the B-side surface where the recess or channel is not formed (t2'>t2),
an average plane for the central rectangular region of the A-side surface is substantially parallel to an average plane for the B-side surface excluding the recess or channel, and
an angle between normal vectors to the two average planes is equal to or less than 5 seconds.

6. The substrate of claim 5 wherein the B-side surface includes an inner rectangular region extending inward from an inside position spaced 3 mm apart from the periphery of the B-side surface and excluding the recess or channel, the inner rectangular region having a flatness of up to 3 μm.

7. The substrate of claim 5 wherein the central rectangular region of the A-side surface has a birefringence of up to 3 nm/cm.

* * * * *